US008625338B2

(12) United States Patent
Zhu et al.

(10) Patent No.: US 8,625,338 B2
(45) Date of Patent: Jan. 7, 2014

(54) ASYMMETRIC WRITE SCHEME FOR MAGNETIC BIT CELL ELEMENTS

(75) Inventors: Xiaochun Zhu, San Diego, CA (US);
Hari M. Rao, San Diego, CA (US);
Jung Pill Kim, San Diego, CA (US);
Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 313 days.

(21) Appl. No.: 12/755,978

(22) Filed: Apr. 7, 2010

(65) Prior Publication Data

US 2011/0249490 A1 Oct. 13, 2011

(51) Int. Cl.
*G11C 11/14* (2006.01)

(52) U.S. Cl.
USPC .......................................... 365/171

(58) Field of Classification Search
USPC .......................................... 365/171
See application file for complete search history.

(56) References Cited

U.S. PATENT DOCUMENTS

| | | | | |
|---|---|---|---|---|
| 8,077,508 B1 * | 12/2011 | Ong | ............................ | 365/171 |
| 2003/0235071 A1 * | 12/2003 | Okazawa | ...................... | 365/158 |
| 2005/0083773 A1 | 4/2005 | Hidaka | | |
| 2008/0007993 A1 | 1/2008 | Saitoh et al. | | |
| 2010/0061144 A1 | 3/2010 | Davierwalla et al. | | |
| 2010/0080053 A1 * | 4/2010 | Li et al. | ......................... | 365/171 |
| 2010/0290280 A1 * | 11/2010 | Seo et al. | ...................... | 365/171 |
| 2011/0249490 A1 * | 10/2011 | Zhu et al. | ...................... | 365/171 |

OTHER PUBLICATIONS

International Search Report and Written Opinion—PCT/US2011/031203, ISA/EOP—May 11, 2011.

* cited by examiner

*Primary Examiner* — Hoai V Ho
*Assistant Examiner* — Pablo Huerta
(74) *Attorney, Agent, or Firm* — Sam Talpalatsky; Nicholas J. Pauley; Joseph Agusta

(57) ABSTRACT

Asymmetric switching is defined for magnetic bit cell elements. A magnetic bit cell for memory and other devices includes a transistor coupled to an MTJ structure. A bit line is coupled at one terminal of the bit cell to the MTJ structure. At another terminal of the bit cell, a source line is coupled to the source/drain terminal of the transistor. The bit line is driven by a bit line driver that provides a first voltage. The source line is driven by a source line driver that provides a second voltage. The second voltage is larger than the first voltage. The switching characteristics of the bit cell and MTJ structure are improved and made more reliable by one or a combination of applying the higher second voltage to the source line and/or reducing the overall parasitic resistance in the magnetic bit cell element.

24 Claims, 14 Drawing Sheets

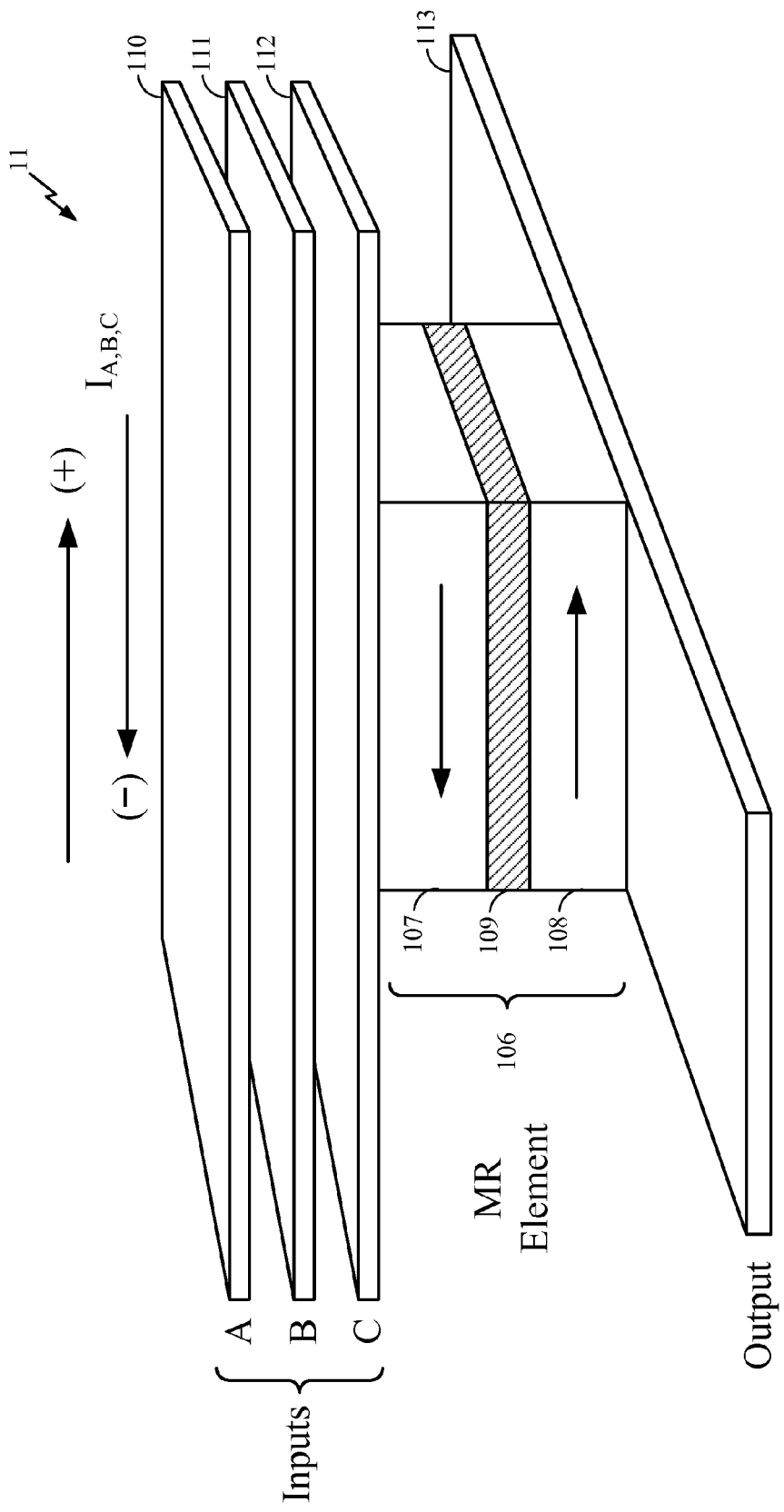

ASYMMETRIC WRITE SCHEME FOR MAGNETIC BIT CELL ELEMENTS

TECHNICAL FIELD

The present teachings relate, in general, to magnetic memory and, in particular, to an asymmetric write scheme in magnetic bit cell elements.

BACKGROUND

The progress and development of magnetoresistive random access memory (MRAM) technology has increased the viability of selecting MRAM for various embedded & standalone nonvolatile memory applications. Instead of storing data as an electric charge, MRAM stores data as magnetic moment. MRAM sensing exploits the magnetoresistive effect that occurs in magnetic tunnel junctions (MTJs). FIG. 1A is a block diagram illustrating a magnetic tunnel junction (MTJ) 10. The MTJ 10 includes a magnetic layer 101, an insulator layer 103, and a magnetic layer 102, an upper contact 104 and a lower contact 105 coupled to a substrate 100. The magnetic layers 101-102 may be constructed from a variety of transitional-metal ferromagnets and other magnetic materials, including cobalt-iron, or the like, or also from combinational layers of various synthetic antiferromagnetic (SAF) and antiferromagnetic (AFM) layers. The insulator layer 103 may also be constructed from a variety of insulating materials, such as magnesium oxide or the like. The current or voltage level applied to the MTJ 10 will control the relative magnetic orientations of the magnetic layers 101-102. In one instance, applying a particular current or voltage level will cause the magnetic orientation in the magnetic layer 101 to be anti-parallel to the magnetic orientation of the magnetic layer 102. Similarly, another current or voltage level will cause the magnetic orientations of the magnetic layers 101-102 to be the same or parallel.

When the magnetic orientations of the magnetic layers 101-102 are parallel, electrons will be more likely to tunnel through the insulator layer 103 than when the magnetic orientations are anti-parallel. This magnetoresistive effect causes the resistance of the MTJ 10 to be high when the magnetic orientations of the magnetic layers 101-102 are anti-parallel and low when the magnetic orientations are parallel. By measuring this resistance, the value of the data stored by the MTJ 10 can be determined.

In the configuration of many MTJ memories, such as the MTJ 10, one of the magnetic layers usually has a fixed magnetic orientation while the other layer is a free floating layer which is capable of having its magnetic orientation change according to the application of the particular current or voltage.

FIG. 1B is a block diagram illustrating a programmable spin-logic device 11 based on a single MTJ element 106. A spin-logic device, such as programmable spin-logic device 11, is a configuration of one or more magnetoresistive devices into various logic elements, such as logic gates. The logic functionality is often obtained by manipulating the switching thresholds of the magnetoresistive devices and places such devices in a particular configuration. The illustrated programmable spin-logic device 11 is merely one example of such a spin-logic device that may be configured as various logic gates, such as AND, OR, NAND, NOR, and the like.

At the core of the programmable spin-logic device 11 is the MTJ element 106. The MTJ element 106 is made up of magnetic layers 107 and 108 with an insulation layer 109 placed between the two magnetic layers 107 and 108. The operation of the MTJ element 106 as a programmable element is similar to the operation described with respect to the MTJ 10 (FIG. 1A). The relative magnetic orientations of the magnetic layers 107 and 108 determine the data stored in the MTJ element 106. Writing the data to the MTJ element 106 involves application of sufficient current or voltage to switch the magnetic orientation of the free magnetic layer. In order to create a programmable logic element, three input contacts 110-112 are provided coupled to the magnetic layer 107 with an output contact 113 coupled to the magnetic layer 108.

In practice, the input contacts 110-112 are operated with positive or negative currents, $\pm I_A$, $\pm I_B$, and $\pm I_C$, of equal magnitude. The magnetic layers 107 and 108 have a magnetism, $\pm M_1$ and $\pm M_2$, respectively, where the $\pm$ reflects the magnetic orientation of either of the magnetic layers 107 and 108. The magnetic layers 107 and 108 also have different coercive fields, $H_{C1}$ and $H_{C2}$, respectively, where $H_{C2}$ is greater than $H_{C1}$. Individually, application of any of the currents $I_A$, $I_B$, and $I_C$ is insufficient to generate enough of a magnetic field to reverse either $M_1$ or $M_2$ However, when $I_A$ and $I_B$ are applied together, enough of a magnetic field is generated to reverse $M_1$ of the magnetic layer 107, while the coercive field, $H_{C2}$, is still large enough to resist reversal. When all three currents are applied together, the combined magnetic field is sufficient to reverse both $M_1$ and $M_2$. Therefore, by manipulating the initial set-up relationship between the magnetic layers 107 and 108, AND and OR gates may be configured using the MTJ element 106 and only the input contacts 110 and 111, and, if the third input contact 112, is used, NAND and NOR gates may be configured.

FIG. 2 is a schematic diagram illustrating the circuit equivalent of a spin torque transfer (STT) MTJ device 20. The STT MTJ device 20 may be implemented as a memory, such as an MRAM, or as some other type of spin-logic device, such as an AND gate. STT technology uses spin-aligned or polarized electrons to directly torque the physical system. Specifically, as electrons flow into a pinned thick magnetic layer, they become polarized. When these polarized electrons come near to the free layer, they will exert a torque tending to change the magnetic orientation of the nearby layer.

Because of its inherent resistance, the MTJ 200 is represented by a resistor in the schematic diagram. This resistance will cause a voltage drop, $V_{MTJ}$, over the MTJ 200. The MTJ 200 is coupled on one side to a bit line 202 and on the other side to the drain contact of the transistor 201. The transistor 201 is coupled at its source contact to a source line 203 and at its gate contact to a word line 204. In order to write data to the STT MTJ device 20, a voltage, $V_{WL}$, is applied to the word line 204. $V_{WL}$ is designed to be sufficient to turn on the transistor 201 in operational conditions.

The value written to the MTJ 200 will depend on how the STT MTJ device 20 loads the transistor 201. When there is a voltage, $V_{BL}$, on the bit line 202 as the word line 204 is activated, and the source line 203 has a relative low voltage, a logical '1' will be written to the MTJ 200. The current direction in the STT MTJ device 20 with this biasing arrangement produces a current flow from the bit line 202 toward the source line 203. This current direction through the MTJ 200 sets up the appropriate relative magnetic layer magnetic orientations that represent a logical '1'. In contrast, when a voltage, $V_{SL}$, is applied to the source line 203 as the word line 204 is activated, and the bit line 202 has a relatively low voltage, the current flow in the STT MTJ device 20 is in the opposite direction (i.e., from the source line 203 toward the bit line 202). This current direction establishes the appropriate magnetic layer magnetic orientations to reflect a logical '0' in the MTJ 200. Because the inherent resistance in the MTJ 200 causes a source loading effect in the write '0' process, it is more difficult to write a '0' in this type of configuration. Moreover, power is wasted because the voltages will be applied to the STT MTJ device 20 longer in order to trigger the state change in the MTJ 200 that produces the '0'.

It should be noted that the MTJ 200 may be coupled into the STT MTJ device 20 in various different ways. As illustrated in FIG. 1A, one of the magnetic layers in an MTJ, such as MTJ 200, will often have a fixed magnetic orientation, while the other magnetic layer has a free floating magnetic orientation. The current flow direction that will generally yield the highest resistance in the MTJ 200 is when the current flow travels from the fixed or reference magnetic orientation layer to the free layer. Thus, in the configuration illustrated in FIG. 2, the free floating magnetic layer side of the MTJ 200 is connected to the transistor 201, while the fixed magnetic layer side of the MTJ 200 is coupled to the bit line 202. Thus, in the write '0' process when the bit line 202 is biased with a relatively low or zero voltage with respect to the source line 203, the current flows in the direction from the source line 203 to the bit line 202. The higher resistance with this direction of current flowing from the free magnetic layer to the fixed or reference magnetic layer results in a higher voltage drop, $V_{MTJ}$, across the MTJ 200, which increases the source loading affect on the transistor 201, which makes it more difficult to actually write the '0' to the MTJ 200. In alternative configurations, where the free magnetic layer is coupled to the bit line 202 and the reference magnetic layer is coupled to the transistor 201, the process for writing a '1' would be more difficult.

FIG. 3 is a schematic diagram illustrating a magnetic memory 30. The magnetic memory 30 includes an array 300 of multiple MTJ memory units 301. The multiple MTJ memory units 301 are arranged in columns 302 within the array 300. The ellipsis 306 in the lines of the columns 302 represent the existence of multiple additional MTJ memory units 301 within the columns 302. Each of the multiple MTJ memory units 301 includes an STT MTJ structure 309 (represented as a resistor) and a transistor 310. The multiple MTJ memory units 301 are coupled to source lines 307 and bit lines 308. The multiple MTJ memory units 301 are also coupled to word lines 305 that trigger a write operation when a sufficient voltage is applied. In order to select the particular memory cell on which to write data, a series of column switches 304 are in place for each of the columns 302. A single set of source and bit line drivers 303 are used to drive each of the source lines 307 and bit lines 308 of the array 300. When a write command is received, an address is received along with it, which, when decoded, allows the magnetic memory 30 to open or close the appropriate ones of the column switches 304. The closed ones of the column switches 304 provide voltage from the source and bit line drivers 303 to the appropriate ones of the source lines 307 and the bit lines 308 corresponding to the memory cells designated by the decoded address. Thus, the voltage provided by the source and bit line drivers 303 will only be applied to the appropriate memory cell associated with the address.

BRIEF SUMMARY

Various embodiments of the present teachings are directed to an asynchronous switching scheme for magnetic bit cell devices. Example magnetic bit cells include a transistor coupled to an STT MTJ structure. At one terminal of the bit cell, a bit line is coupled to the STT MTJ structure. At another terminal of the bit cell, a source line is coupled to the source/drain terminal of the transistor. The bit line is driven by a bit line driver that provides a first voltage to the bit line. The source line is driven by a source line driver that provides a second voltage to the source line. The second voltage is larger than the first voltage. In an MRAM array configuration, the switching characteristics of the bit cell and STT MTJ structure are improved and made more reliable by one or a combination of applying the higher second voltage to the source line and/or reducing the overall bit line and source line parasitic resistance.

Representative embodiments of the present teachings are directed to magnetic bit cell write circuits. Such write circuits include a first write driver applying a first voltage, a second write driver applying a second voltage that is higher than the first voltage, and at least one MTJ structure coupled at one terminal to the first write driver and coupled at another terminal to the second write driver, wherein the MTJ structure receives the first voltage to change from a first state to a second state and receives the second voltage to change from the second state to the first state.

Further representative embodiments of the present teachings are directed to MRAM devices that include a plurality of memory columns. Each of these memory columns has at least one magnetic bit cell. The MRAM devices also have a plurality of source lines. Each of these source lines is associated with a corresponding column of the memory columns and is coupled to one terminal of the magnetic bit cell of the corresponding column. The MRAM devices also have a plurality of bit lines. Each of these bit lines is associated with the corresponding column and coupled to another terminal of the magnetic bit cell of the corresponding column. The MRAM devices also have a plurality of first drivers. Each of these first drivers is coupled to a corresponding source line and applies a first driver voltage to change the magnetic bit cell from a first state to a second state. The MRAM devices also have a plurality of second drivers. Each of these second drivers is coupled to a corresponding bit line and applies a second driver voltage to change the magnetic bit cell from the second state to the first state.

Still further representative embodiments of the present teachings are directed to methods for writing to an MTJ structure of a magnetic bit cell element. These methods include receiving a write signal on a word line associated with the MTJ structure, detecting write data to be written to the MTJ structure in response to the write signal, and receiving a first voltage on a bit line coupled to one terminal of the MTJ structure in response to the write data being a first value. The first voltage causes the MTJ structure to change from a first state to a second state. The methods also include receiving a second voltage on a source line coupled to another terminal of the MTJ structure in response to the write data being a second value. The second voltage is higher than the first voltage and causes the MTJ structure to change from the second state to the first state.

Additional representative embodiments of the present teachings are directed to methods for writing to an MTJ structure of a magnetic bit cell element. These methods include the steps of receiving a write signal on a word line associated with the MTJ structure, detecting write data to be written to the MTJ structure in response to the write signal, and receiving a first voltage on a bit line coupled to one terminal of the MTJ structure in response to the write data being a first value. The first voltage causes the MTJ structure to change from a first state to a second state. The methods also include receiving, in response to the write data being a second value, a second voltage on a source line coupled to another terminal of the MTJ structure. This second voltage is higher than the first voltage and causes the MTJ structure to change from the second state to the first state.

Further representative embodiments of the present teachings are directed to systems for writing to an MTJ structure of a magnetic bit cell element. These systems include means for receiving a write signal on a word line associated with the MTJ structure, means, executable in response to the write signal, for detecting write data to be written to the MTJ structure, means, executable in response to the write data being a first value, for receiving a first voltage on a bit line coupled to one terminal of the MTJ structure, the first voltage causing the MTJ structure to change from a first state to a second state, and means, executable in response to the write data being a second value, for receiving a second voltage on a source line coupled to another terminal of the MTJ structure, the second voltage higher than the first voltage and causing the MTJ structure to change from the second state to the first state.

The foregoing has outlined rather broadly the features and technical advantages of the present disclosure in order that the detailed description that follows may be better understood. Additional features and advantages can be described hereinafter, which form the subject of the claims of the disclosure. It should be appreciated by those skilled in the art that the conception and specific aspects disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features, which are believed to be characteristic of the disclosure, both as to its organization and method of operation, together with further objects and advantages, can be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present teachings, reference is now made to the following description taken in conjunction with the accompanying drawings.

FIG. 1B is a block diagram illustrating an MTJ spin-logic device.

DETAILED DESCRIPTION

Magnetic bit cell elements, such as those used in MRAM, spin-logic devices or the like, may be used in systems that maintain multiple internal networks for power saving purposes. These systems include devices such as mobile devices, mobile phones, and the like. The core network of such a device is generally considered the circuitry that operates the core functionality of the device. The device may also have an input/output (I/O) network, which handles all external communication between the device and external components or devices. The core network will communicate with the I/O network in order to transmit or receive signals external to the device. Often times, the I/O network will operate at a different, higher voltage level than the core network. The higher voltage may be used to drive the components that consume more power, such as transmitters, receivers, and the like. In such instances, the core network communicates with the I/O network through multiple level shifters which shift the voltage levels between the two networks.

In such devices, an MRAM or possibly a spin-logic device is often part of the core network. Thus, the voltage provided to these elements is based on the lower core voltage. As noted above, the source loading effect in an STT MTJ device often makes it more difficult to write a '0' to the memory or programmable part of the cell (when the fixed or reference magnetic layer or magnetic layer having the higher coercive field is coupled to the bit line). In operation, because these STT MTJ devices are also generally powered with the lower core voltages, the write '0' difficulties can become even more acute.

Figure 1A:
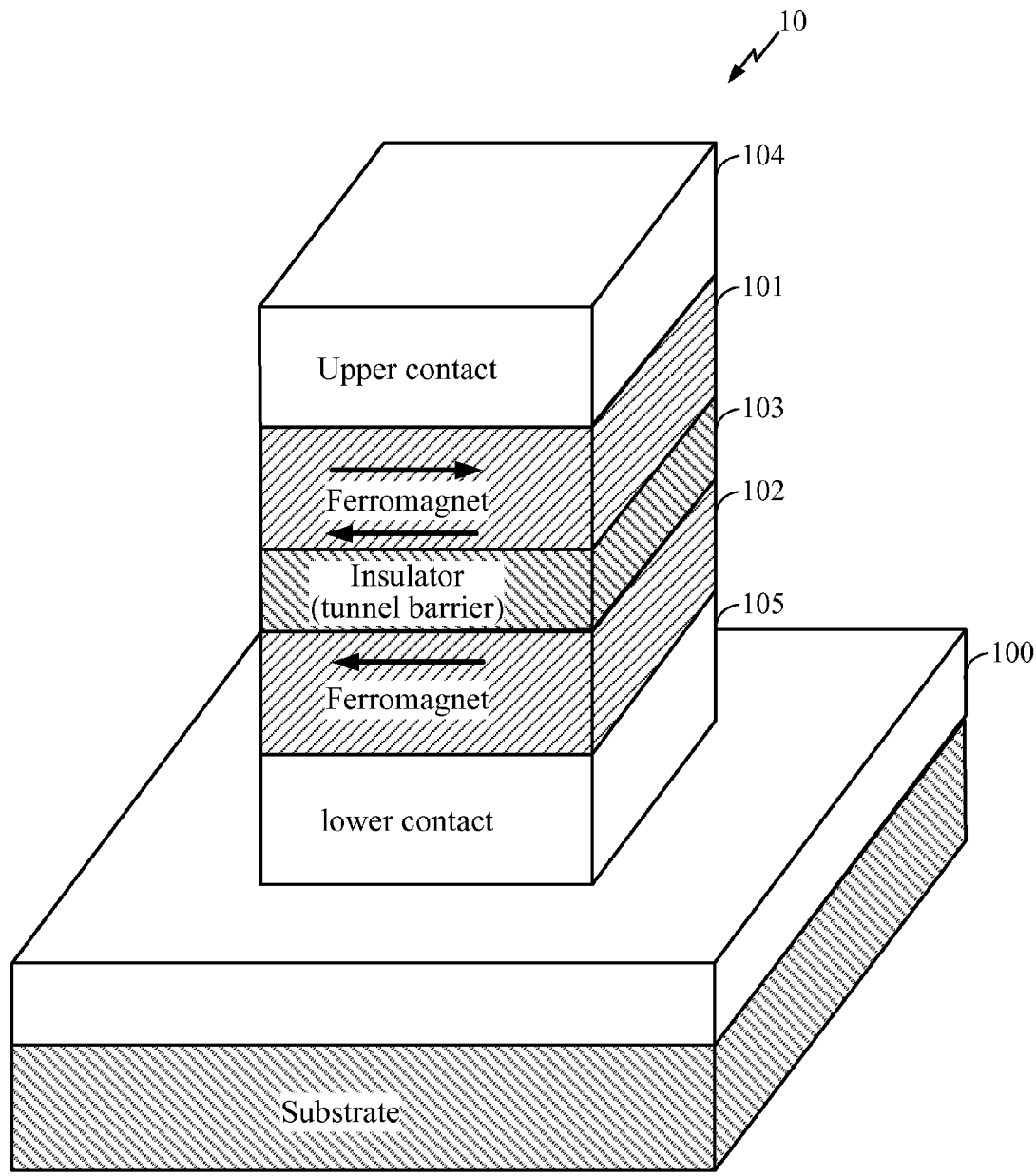
FIG. 1A is a block diagram illustrating a magnetic tunnel junction (MTJ).
Figure 2:
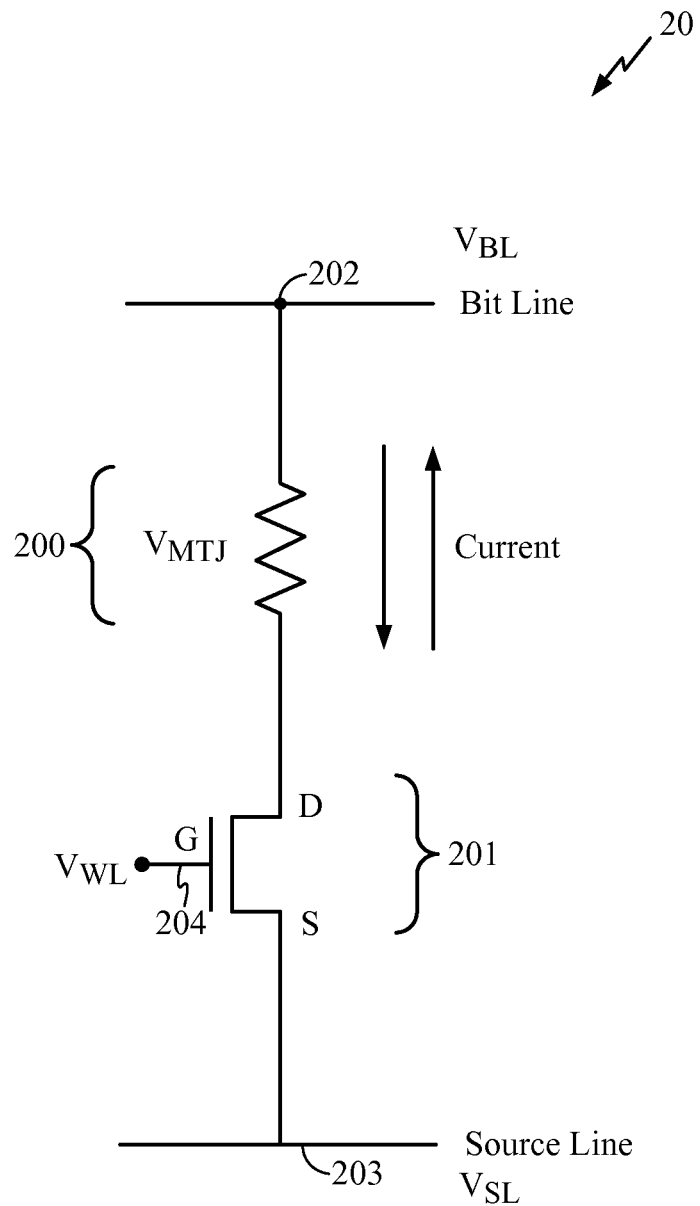
FIG. 2 is a schematic diagram illustrating a circuit equivalent of a spin torque transfer (STT) MTJ device.
Figure 3:
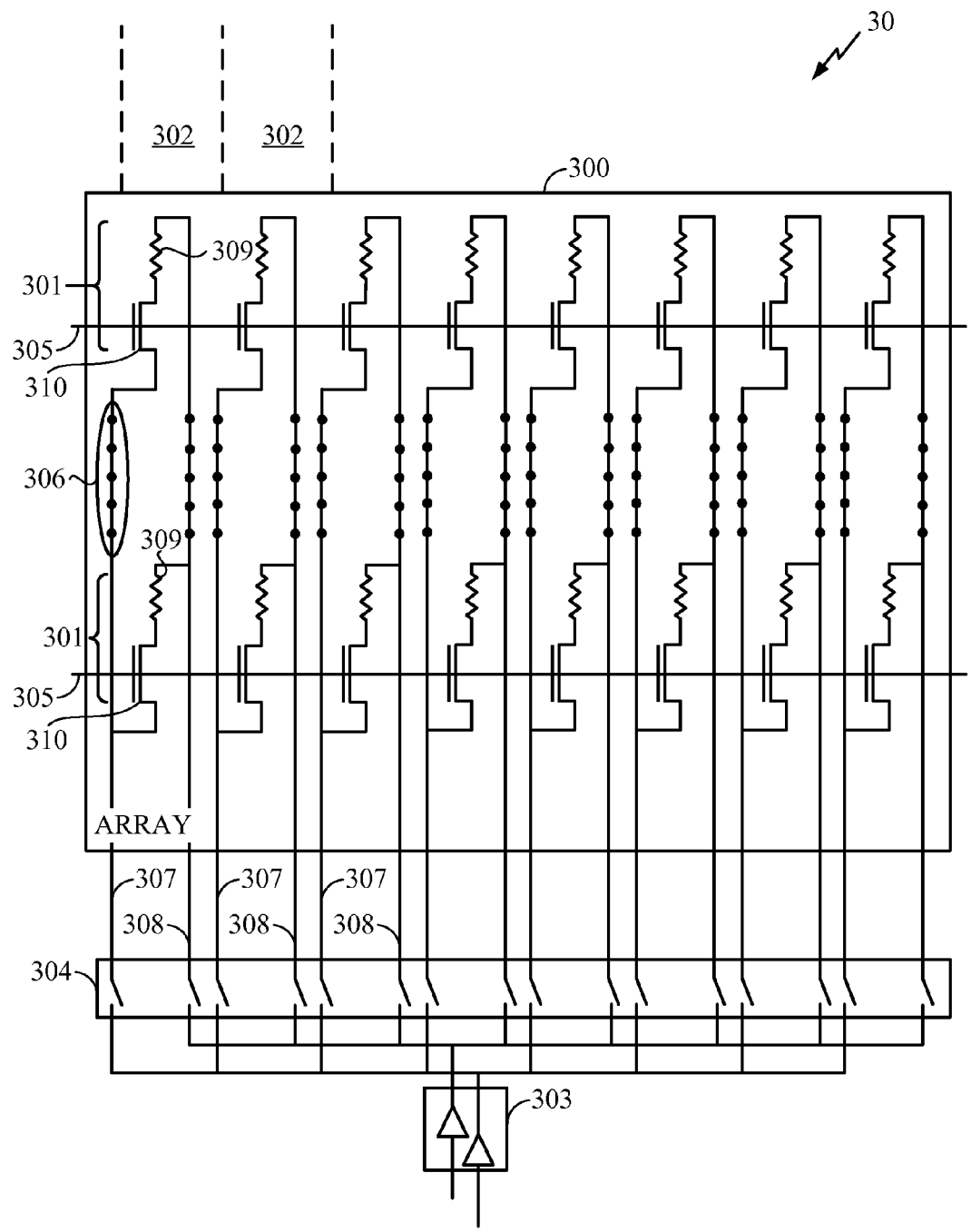
FIG. 3 is a schematic diagram illustrating a magnetic memory.
Figure 4:
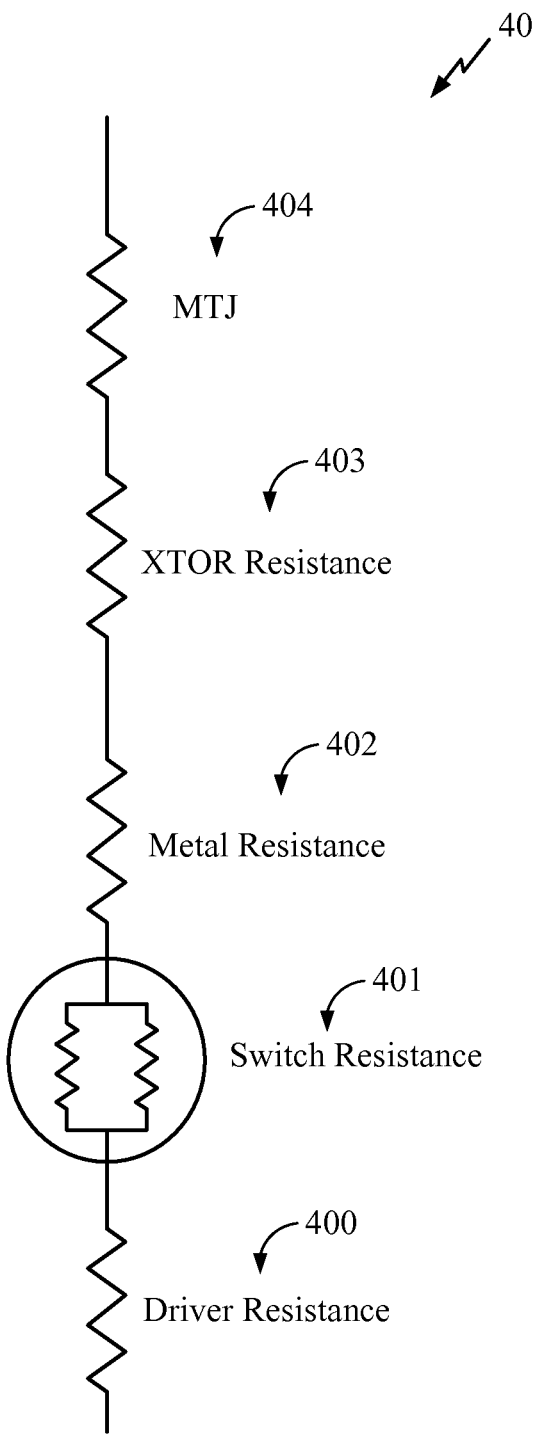
FIG. 4 is a schematic diagram illustrating an MTJ column circuit equivalent of a column in the magnetic memory of FIG. 3.

FIG. 4 is a schematic diagram illustrating an MTJ column circuit equivalent 40 of a column 302 in the magnetic memory 30 of FIG. 3. In order to ensure proper operation of a memory cell, such as MTJ memory unit 301 (FIG. 3), certain voltage drops will be maintained across the MTJ structure 309 (FIG. 3). The specific voltage drops will control the MTJ structure 309 (FIG. 3) switching between parallel and anti-parallel magnetic orientations, thus, switching memory values. However, in operation, parasitic resistances may cause insufficient voltages to be applied at each terminal of the MTJ structure 309 (FIG. 3) and, even before that, at the terminals of the transistor 310 (FIG. 3). These parasitic resistances are illustrated in the MTJ column circuit equivalent 40. In the entire length of the column 302 (FIG. 3), there is an equivalent parasitic resistance resulting from the source and bit line drivers 303 (FIG. 3)—a driver resistance 400, from column switches 304 (FIG. 3)—a switch resistance 401, from the inherent resistance in the conducting traces of the magnetic memory 30 (FIG. 3)—a conducting trace resistance 402, from the transistor 310 (FIG. 3)—an XTOR resistance 403, and then from the MTJ structure 309 (FIG. 3) itself—an MTJ resistance 404. Therefore, the voltages seen at each terminal of the MTJ structure 309 (FIG. 3) will be reduced by the voltage drops caused by each of the effective resistances. The resulting switching conditions on the MTJ structure 309 (FIG. 3) may, at various times, be inadequate to ensure proper operation, which affects the overall operation of the MTJ memory unit 301 (FIG. 3). Moreover, the voltage applied at the terminals of the transistor 310 (FIG. 3) may also not be sufficient to activate the transistor 310 (FIG. 3). Because the proper operation is not guaranteed with this configuration, operation of the magnetic memory 30 (FIG. 3) will not be reliable.

Figure 5:
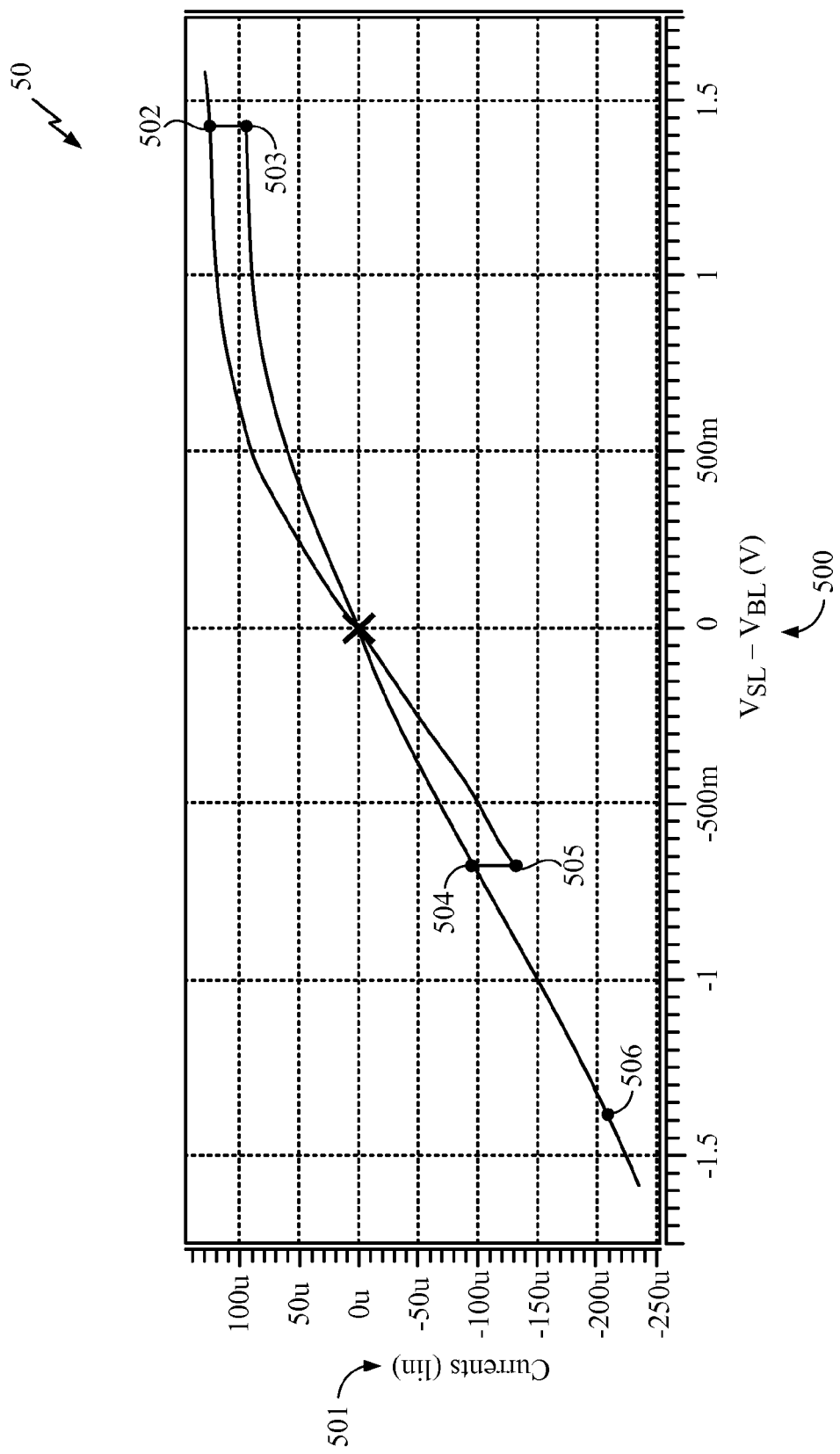
FIG. 5 is a hysteresis graph illustrating the current flow through an STT MTJ memory cell as a function of the bit cell biasing voltage.

FIG. 5 is a hysteresis graph 50 illustrating a current flow 500 through an STT MRAM memory cell as a function of the bit cell biasing voltage 501. The hysteresis graph 50 illustrated in FIG. 5 represents the current flow 500 in the STT MRAM in which the MTJ free layer is coupled to the source line of the STT MRAM transistor, while the MTJ reference layer is coupled to the bit line. The bit cell biasing voltage 501 is represented by the source line voltage ($V_{SL}$) minus the bit line voltage ($V_{BL}$). At point 503, the current flowing through the MTJ jumps from approximately 90 μA to approximately 130 μA at point 502. Thus, resistance has decreased in the MTJ indicating the MTJ switching from the higher resistance state to the lower resistance state. This switching point corresponds to a voltage of approximately 1.4 V at the source line and 0 V at the bit line.

As the bit cell bias voltage 501 decreases, the current flowing through the MTJ eventually reverses direction. At point 505, the current flowing through the MTJ reaches approximately −130 μA. It then drops to approximately −90 μA at point 504. Therefore, the MTJ switches from its low resistance state to its higher resistance state at points 505/504. The bit cell bias voltage 501 at points 504/505 is approximately −700 mV on the bit line with 0 V on the source line.

In analyzing the switching characteristics of the MTJ, it can be seen from the hysteresis graph 50 that MTJ switching occurs at asymmetric voltages. Thus, for MTJ switching to be completed, $V_{BL}$ may be lower than 1 V and $V_{SL}$ should be larger than 1.4 V. In many applications, it is less complex to provide symmetric biasing than asymmetric biasing. However, the limitations of MTJ structures would prevent such configurations. Certainly, if $V_{BL}$ and $V_{SL}$ were both biased at a value of 700 mV (−/+), the MTJ may switch from the lower resistance state to the higher resistance state, but it will not switch from the high resistance state to the lower resistance state. Conversely, if $V_{BL}$ and $V_{SL}$ were both biased at 1.4 V, the MTJ may switch from the high resistance state, but, at the other end of the spectrum, the MTJ structure may breakdown after switching states from low to high resistance. The point 506 represents the point at which the MTJ structure begins to breakdown. The voltage drop across the MTJ bit cell structure at point 506 is approximately −1.4 V. These operating conditions may get even worse, with breakdown occurring earlier or switching occurring at different voltage drops with variations in the process corners. Therefore, in order to maintain reliable operation, symmetric biasing mechanism may not be used.

Figure 6:
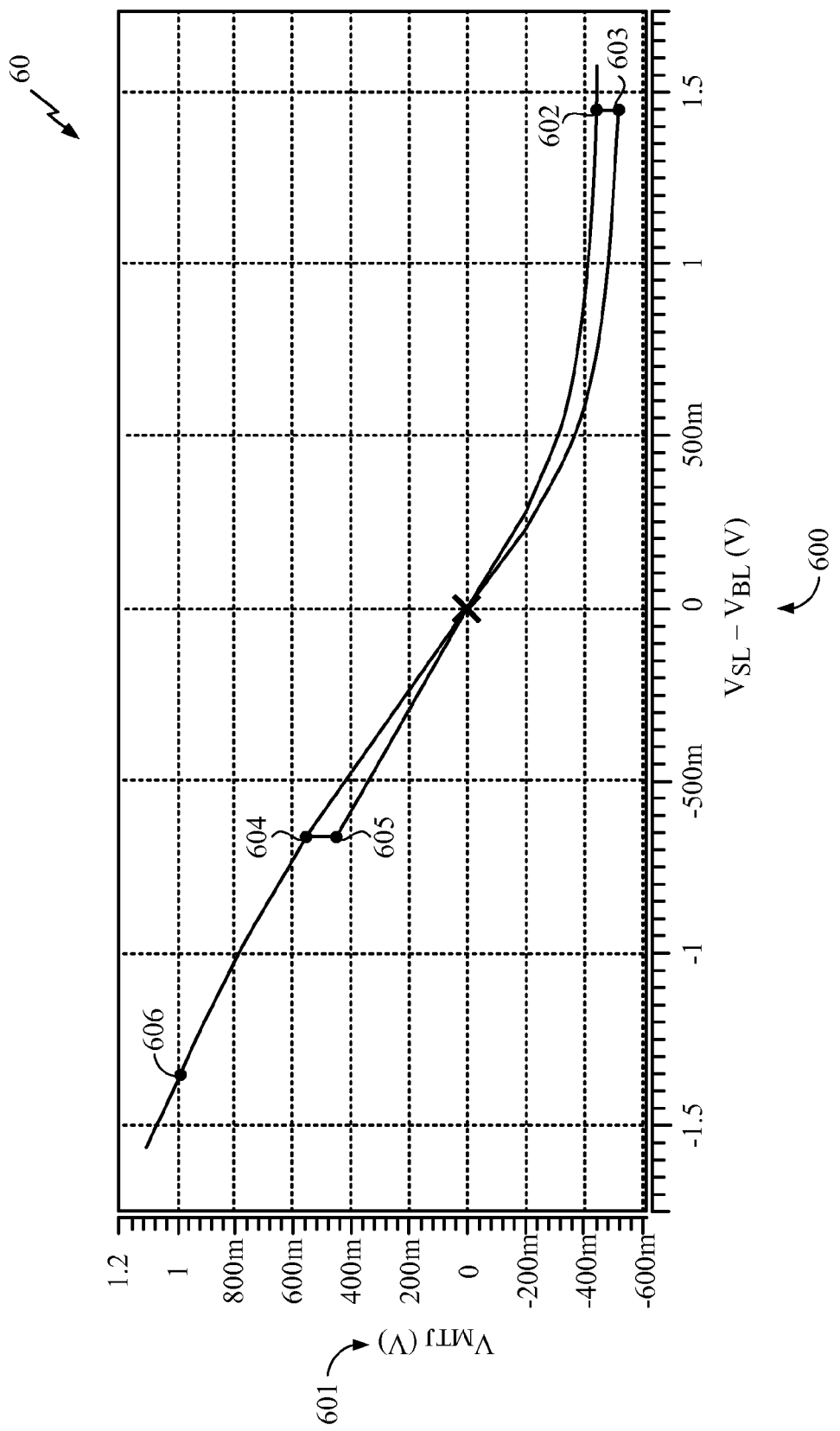
FIG. 6 is a hysteresis graph illustrating the voltage drop across the MTJ structure ($V_{MTJ}$) as a function of the bit cell bias voltage.

FIG. 6 is a hysteresis graph 60 illustrating a voltage drop across the MTJ structure ($V_{MTJ}$ 600) as a function of the bit cell bias voltage 601. The switching of the MTJ structure is shown to occur at points 602/603 and at points 604/605. Again, as reflected in hysteresis graph 60, the switch at points 602/603 occurs with $V_{SL}$ at approximately 1.4 V with $V_{BL}$ at 0 V, and the switch at points 604/605 occurs with $V_{BL}$ at approximately −700 mV with $V_{SL}$ at 0 V. The $V_{MTJ}$ 600 at the points 602/603 switch is approximately −450 mV, at point 602, and approximately −520 mV, at point 603. As the bit cell bias voltage 601 increases beyond 1.5 V, the trend in the hysteresis graph 60 suggests that the $V_{MTJ}$ 600 only slowly increases, with the slope of the curve appearing to approach zero before reaching a voltage drop of −600 mV.

Considering the switch at points 604/605, the $V_{MTJ}$ 600 is approximately 520 mV at point 604, and approximately 450 mV at point 605. Beyond this switch at points 604/605, as a larger voltage is applied at $V_{BL}$, the corresponding value of the $V_{MTJ}$ 600 continues to increase at a steady rate. However, once the $V_{MTJ}$ 600 reaches approximately 1 V, at point 606, the danger of the MTJ structure breaking down increases dramatically. When the MTJ structure breaks down, it may no longer reliably be used as a memory circuit until the structure exits the break down conditions. Therefore, in analyzing the switching characteristics for an MTJ in the context of the $V_{MTJ}$ 600, the circuit should attempt to limit $V_{MTJ}$ 600 to an amount lower than approximately 1 V.

It should be noted that the voltage and current values disclosed with regard to FIGS. 5 and 6 and each of the other FIGURES provided for in this application are merely examples and are not intended to limit the scope and application of the present teachings to any such values or materials which might reflect those values. The various embodiments of the present teachings may operate with any various types of material that reflect other values and still fall within the scope of this disclosure.

Figure 7:
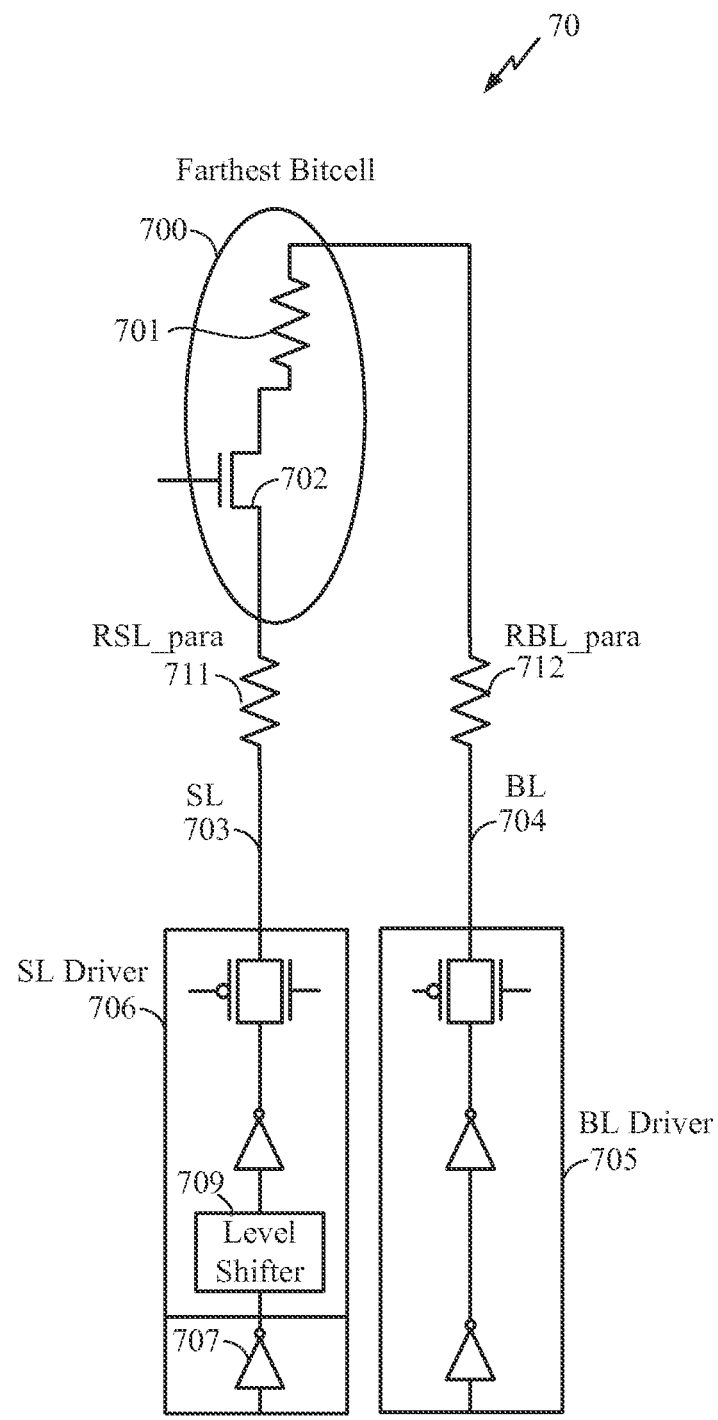
FIG. 7 is a representative schematic diagram of a memory cell configured according to one embodiment of the present teachings.

In order to address the switching issues experienced with MTJs, a new memory configuration is presented that provides an asymmetric switching scheme in which one of the bit/source lines is coupled to the core network voltage, while the other source/bit line is coupled to the I/O network voltage. In this configuration, the I/O voltage provides a higher voltage than the core network voltage. FIG. 7 is a representative schematic diagram of a memory cell 70 configured according to one embodiment of the present teachings. The memory cell 70 illustrates the furthest bit cell 700 in a column of a magnetic memory (not shown). The bit cell 700 includes an MTJ structure 701 (represented as a resistor) and a transistor 702. A source line 703 is coupled to a source/drain terminal of the transistor 702, while a bit line 704 is coupled to a terminal of the MTJ structure 701.

The bit line 704 is driven by a bit line driver 705. The bit line driver 705 operates within the core network providing core voltage levels to the bit line 704. The source line 703 is driven by a source line driver 706. The source line driver 706 operates to provide I/O network voltage to the source line 703. A core network buffer 707 and the source line driver 706 communicate at an interface provided by a level shifter 709, which is capable of shifting voltage levels between the two different voltages of the core and I/O networks.

The memory cell 70 may reside in a magnetic memory such as the magnetic memory 30 (FIG. 3). In such an example implementation, the source and bit line drivers 303 (FIG. 3) would be modified to conform to the configuration of the bit line driver 705 and the source line driver 706. This would enable each of the source lines 307 (FIG. 3) with the higher I/O voltage. In the overall circuit of the memory cell 70, a parasitic source resistance 711 and a parasitic bit line resistance 712 still exist because of the inherent resistance added by the source line driver 706, the bit line driver 705, the conducting trace resistance 402 (FIG. 4), and the transistor 702. However, because the higher I/O voltage is applied to the source line 703, there will be a sufficient voltage level at the source/drain terminal of the transistor 702 to turn it on and sufficient voltage to cause the MTJ structure 701 to switch states, even with the slightly increased voltage drop across the parasitic source line resistance 711 due to the higher I/O voltage.

Figure 8:
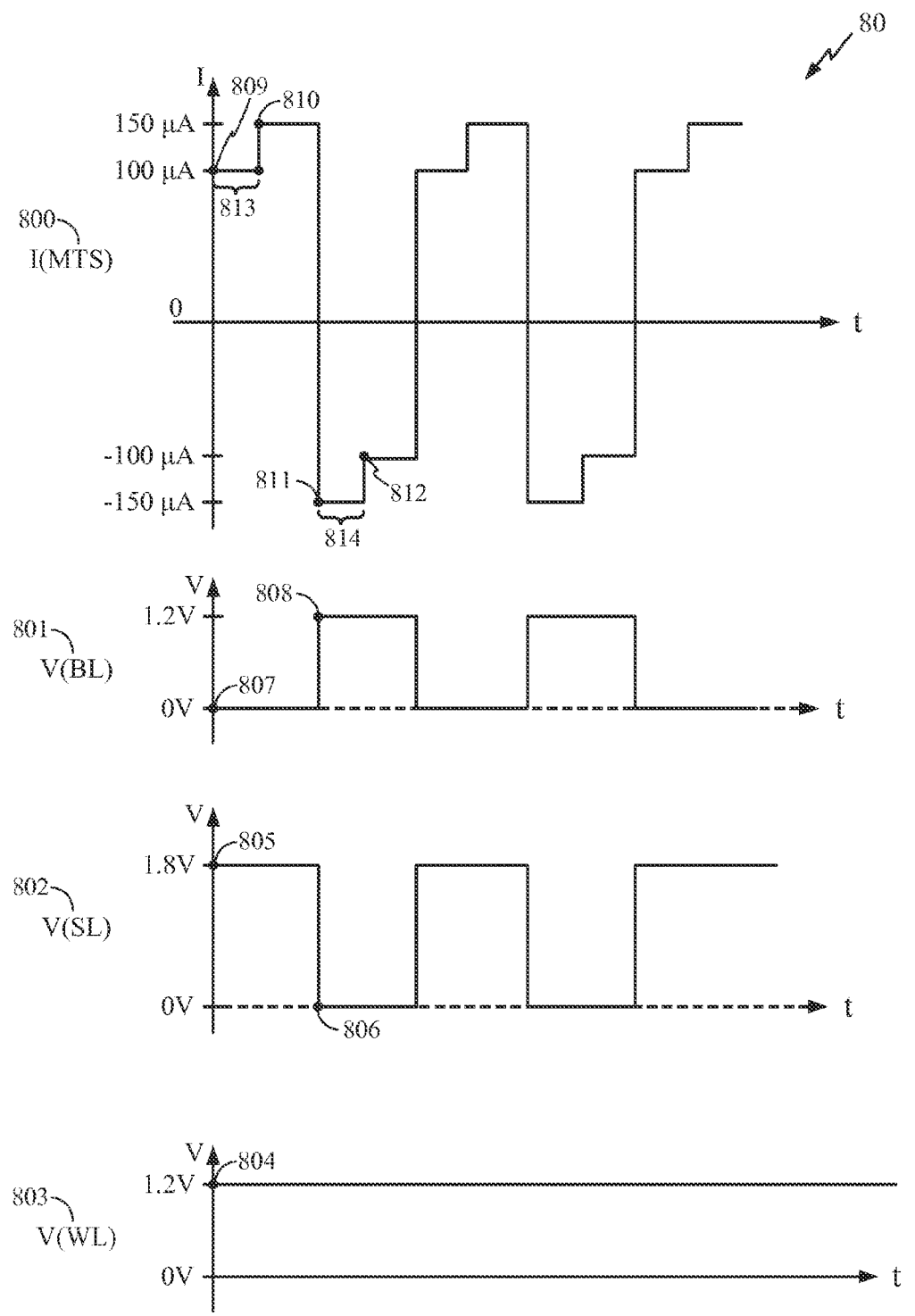
FIG. 8 is a performance record for an STT MTJ MRAM cell configured according to one embodiment of the present teachings.

FIG. 8 is a performance record 80 for an STT MRAM cell configured according to one embodiment of the present teachings. The STT MRAM cell related to the performance record 80 is configured much like the memory cell 70 (FIG. 7), with the source line being coupled to a source line driver enabled to provide a higher voltage than that provided on the bit line. The performance record 80 includes graphs of the current flowing through the MTJ structure, I(MTJ) 800, the bit line biasing voltage, V(BL) 801, the source line biasing voltage, V(SL) 802, and the word line voltage, V(WL) 803, each as a function of the same testing time line. Beginning at point 804 and throughout the testing time line, the V(WL) 803 is set to its high state. For purposes of the example illustrated in FIG. 8, the high state of the V(WL) 803 is 1.2 V. Thus, a write command is present for the duration of the testing time line.

The V(SL) 802 begins at point 805 set to its high state. For purposes of the example illustrated in FIG. 8, the high state of the V(SL) 802 is 1.8 V. This high state reflects a higher voltage level than the voltage available for the V(WL) 803. The V(BL) 801 begins at point 807 set to its low state. For purposes of the example illustrated in FIG. 8, the low states for each of the V(WL) 803, the V(SL) 802, and the V(BL) 801 is 0 V. Moreover, the high state of V(BL) 801 is 1.2 V. With the V(WL) 803 activated in a write command, the source line biased at the V(SL) 802 in its high state, and the bit line biased at the V(BL) 801 in its low state, the I(MTJ) 800 is measured at the beginning point 809 to be 100 μA. At point 810, the I(MTJ) 800 jumps to a current of 150 μA. This sudden increase in current flow at I(MTJ) 800 is a result of the resistance in the STT MTJ structure decreasing, thus, indicating the MTJ structure has switched states.

At point 806, the V(SL) 802 switches to its low state, while the V(BL) 801 switches to its high state at point 808. This change in bit cell biasing causes the I(MTJ) 800 to reverse current direction, but still remain at its high state at point 811. At point 812, the I(MTJ) 800 jumps from the high current state to a low current state. This sudden decrease in current flow at I(MTJ) 800 is a result of the resistance in the MTJ structure increasing, thus, indicating the MTJ structure has again switched states. This current signature continues in the I(MTJ) 800 for the remainder of the testing time line. In applying a higher voltage level to the V(BL) 802, the MTJ structure may be switched more reliably. The time periods 813 and 814 represent the switching speed for switching from the high resistance, at point 809, to the lower resistance, at point 810, and for switching from the low resistance, at point 811, to the higher resistance, at point 812, respectively.

The parasitic resistances 711 and 712 (FIG. 7) have a voltage-reducing effect, such that voltages applied at the terminals of a representative bit cell, such as the bit cell 700 (FIG. 7), will be less than the full amount provided to the source and bit lines by the source and bit line drivers. This reduction in voltage makes operation of the bit cell even more difficult. As illustrated above, a certain voltage differential is needed to cause the MTJ structure, such as MTJ structure 701 (FIG. 7), to switch states. Additionally, before the MTJ structure switches states, the voltage relationships will need to be sufficient to activate the bit cell transistor, such as transistor 702 (FIG. 7). Therefore, another way to increase the voltage applied at the bit cell terminals is to reduce the overall resistance between the source and bit line drivers and the bit cell terminals.

Figure 9:
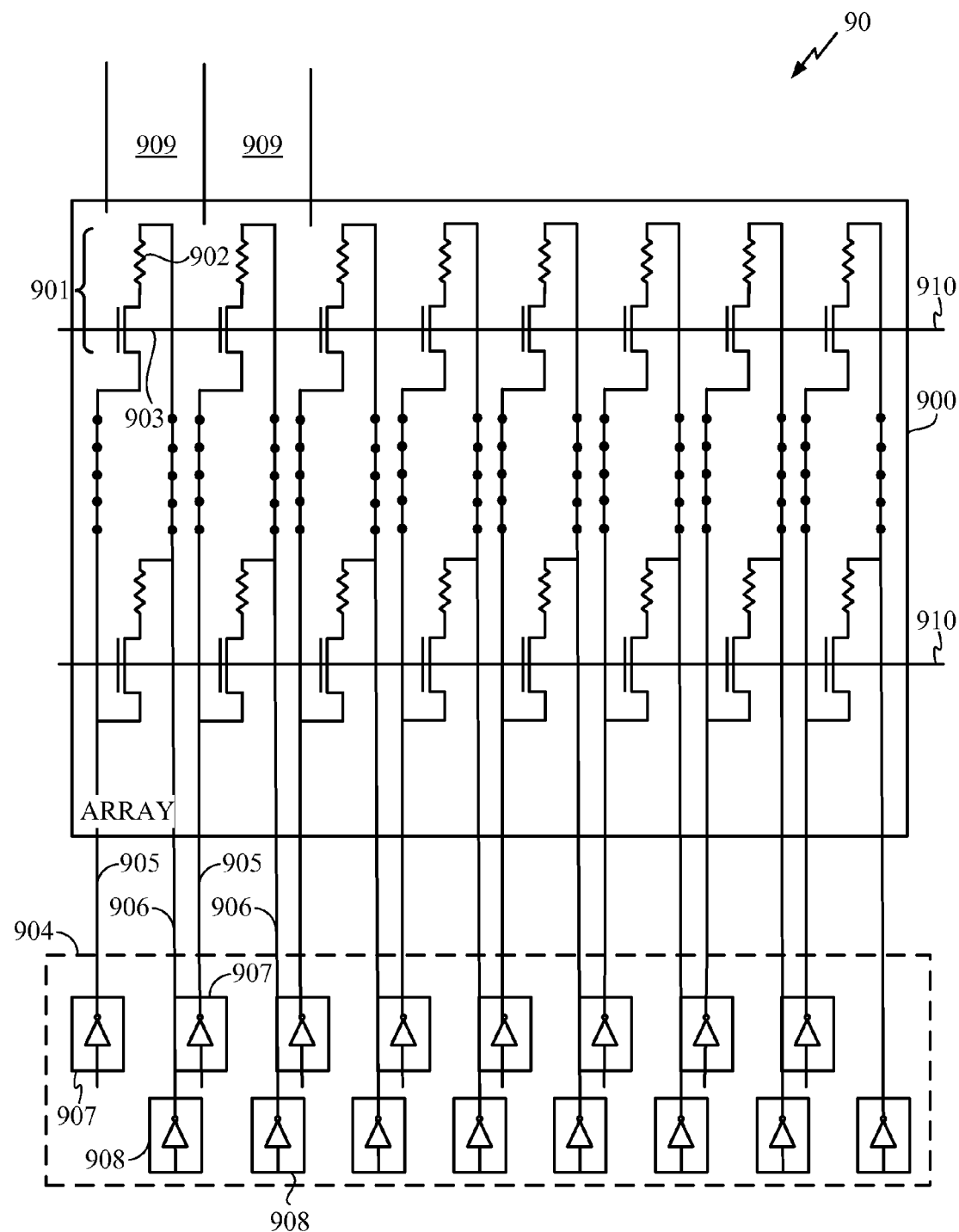
FIG. 9 is a schematic diagram illustrating a magnetic memory configured according to one embodiment of the present teachings.

FIG. 9 is a schematic diagram illustrating a magnetic memory 90 configured according to one embodiment of the present teachings. The magnetic memory 90 includes an array 900 of multiple memory bit cells 901 configured in a series of columns 909. Each of the memory bit cells 901 includes an MTJ structure 902 and a transistor 903, where the gate terminals of the transistors 903 are coupled to a word line 910. The source lines 905 and the bit lines 906 couple the memory bit cells 901 to a driving location 904. In contrast to the magnetic memory 30 (FIG. 3), which includes the column switches 304 and a single, shared source and bit line drivers 303 (FIG. 3), the magnetic memory 90 is configured with a high voltage driver 907 and a low voltage driver 908 for each one of the source lines 905 and the bit lines 906, respectively. The high voltage drivers 907 are coupled to the source lines 905, while the low voltage drivers 908 are coupled to the bit lines 906. The high voltage drivers 907 and the low voltage drivers 908 also include selection logic, which provides the functionality previously supplied by the column switches 304 (FIG. 3). By removing the column switches 304 (FIG. 3) and the single, shared source and bit line drivers 303 (FIG. 3), the net effect of the addition of the individual high voltage drivers 907 and the low voltage drivers 908 is a significant reduction in resistance between the drivers and the memory bit cells 901. This reduction in resistance translates into a higher effective voltage applied at the terminals of the memory bit cells 901, which results in a more reliable writing process for the memory bit cells 901.

It should be noted that the addition of each of the high voltage drivers 907 and low voltage drivers 908 may increase the chip area used to integrate a magnetic memory, such as the magnetic memory 90. However, the negative effects of the increased chip area are countered by the increased performance benefits realized by reducing the total resistance in the memory. The column switches 304 (FIG. 3) provide significant resistance in the memory, not only caused by the resistance in any one switch, but, because the resistance of the column switches 304 (FIG. 3) is experienced in parallel, the total resistance in each of the columns 302 (FIG. 3) is significantly higher than the resistance of a single switch. Furthermore, because of the location of the column switches 304 (FIG. 3), the source and bit line drivers 303 (FIG. 3) need to be more robust, in order to account for the added resistance of the column switches 304 (FIG. 3). Without the column switches, each of the individual high voltage drivers 907 and low voltage drivers 908 do not need to be as robust as the source and bit line drivers 303 (FIG. 3), thus, adding less resistance and individually requiring substantially less chip area.

Figure 10:
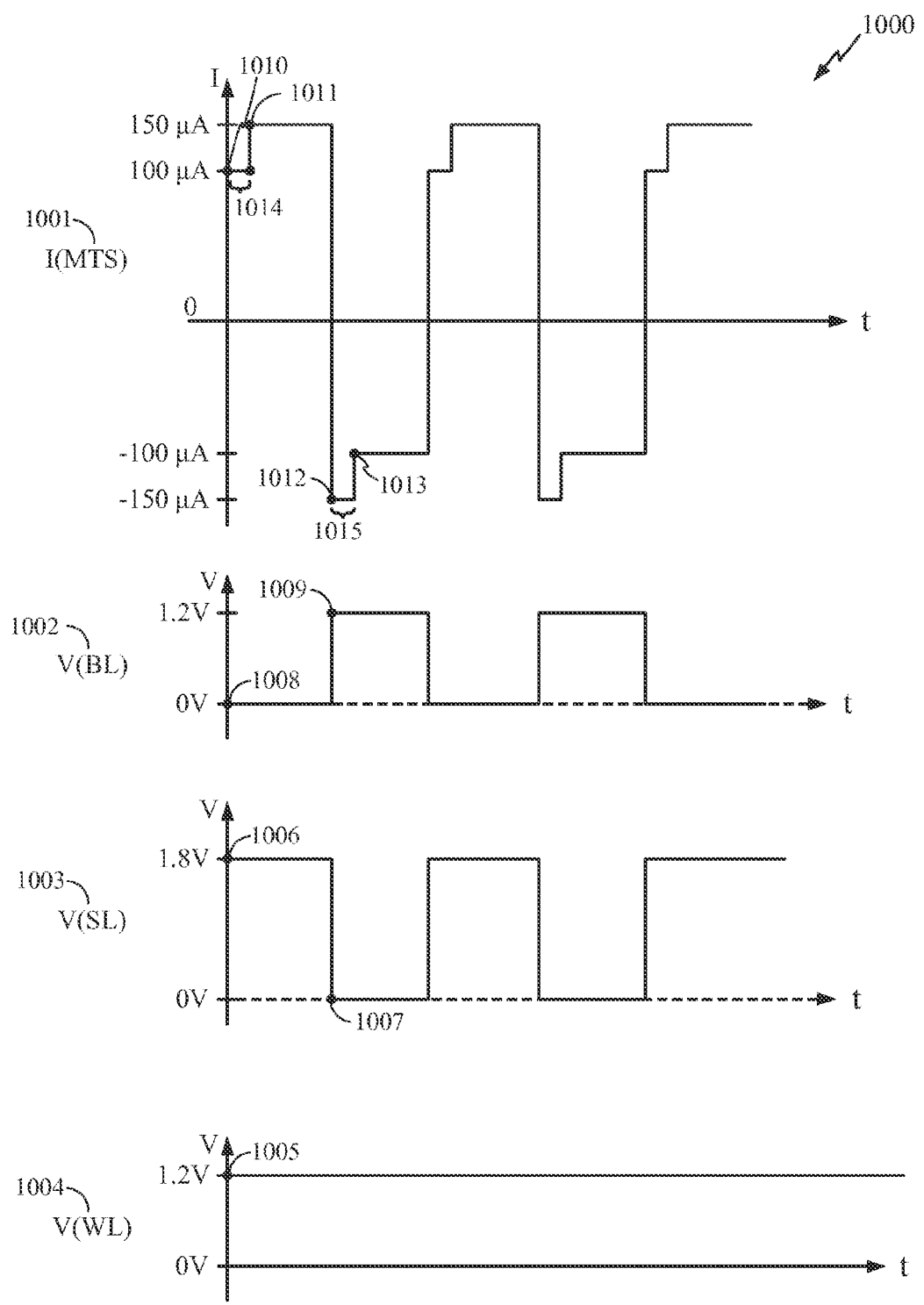
FIG. 10 is a performance record for an STT MTJ MRAM cell configured according to one embodiment of the present teachings.

FIG. 10 is a performance record 1000 for an STT MRAM cell configured according to one embodiment of the present teachings. The STT MRAM cell related to the performance record 1000 is configured much like the magnetic memory 90 (FIG. 9), with the source line being coupled to a source line driver enabled to provide a higher voltage than that provided on the bit line. The performance record 1000 includes graphs of the current flowing through the MTJ structure, I(MTJ)

1001, the bit line biasing voltage, V(BL) 1002, the source line biasing voltage, V(SL) 1003, and the word line voltage, V(WL) 1004, each as a function of the same testing time line. Beginning at point 1005 and throughout the testing time line, the V(WL) 1004 is set to its high state. For purposes of the example illustrated in FIG. 10, the high state of the V(WL) 1004 is 1.2 V. Thus, a write command is present for the duration of the testing time line.

The V(SL) 1003 begins at point 1006 set to its high state. For purposes of the example illustrated in FIG. 10, the high state of the V(SL) 1003 is 1.8 V. This high state reflects a higher voltage level than the voltage available for the V(WL) 1004. The V(BL) 1002 begins at point 1008 set to its low state. For purposes of the example illustrated in FIG. 10, the low states of each of the V(WL) 1004, the V(SL) 1003, and the V(BL) 1002 are 0 V. Moreover, the high state of V(BL) 1002 is 1.2 V, which is the same lower voltage available to the V(WL) 1004. With the V(WL) 1004 activated in a write command, the source line biased at the V(SL) 1003 in its high state, and the bit line biased at the V(BL) 1002 in its low state, the I(MTJ) 1001 is measured at the beginning point 1010 to be 100 µA. At point 1011, the I(MTJ) 1001 jumps to a current of 150 µA. This sudden increased current flow at I(MTJ) 1001 is a result of the resistance in the MTJ structure decreasing, thus, indicating the MTJ structure has switched states.

At point 1007, the V(SL) 1003 switches to its low state, while the V(BL) 1002 switches to its high state at point 1009. This change in bit cell biasing causes the I(MTJ) 1001 to reverse current direction, but still remain at its high current state at point 1012. At point 1013, the I(MTJ) 1001 jumps from the high current state to a low current state. This sudden decrease in current flow at I(MTJ) 1001 is a result of the resistance in the MTJ structure increasing, thus, indicating that the MTJ structure has again switched states. This current signature continues in the I(MTJ) 1001 for the remainder of the testing time line. In applying a higher voltage level to the V(BL) 1002, the MTJ structure may be switched more reliably. The time periods 1014 and 1015 represent the switching speed for switching from the high resistance, at point 1010, to the lower resistance, at point 1011, and for switching from the low resistance, at point 1012, to the higher resistance, at point 1013, respectively. The time periods 1014 and 1015 have been reduced in comparison with the switching speed time periods 813 and 814 (FIG. 8) as a result of the significant reduction in total parasitic resistance between the line drivers, such as the high voltage drivers 907 (FIG. 9) and the low voltage drivers 908 (FIG. 9), and the individual bit cells, such as bit cells 901 (FIG. 9).

Figure 11:
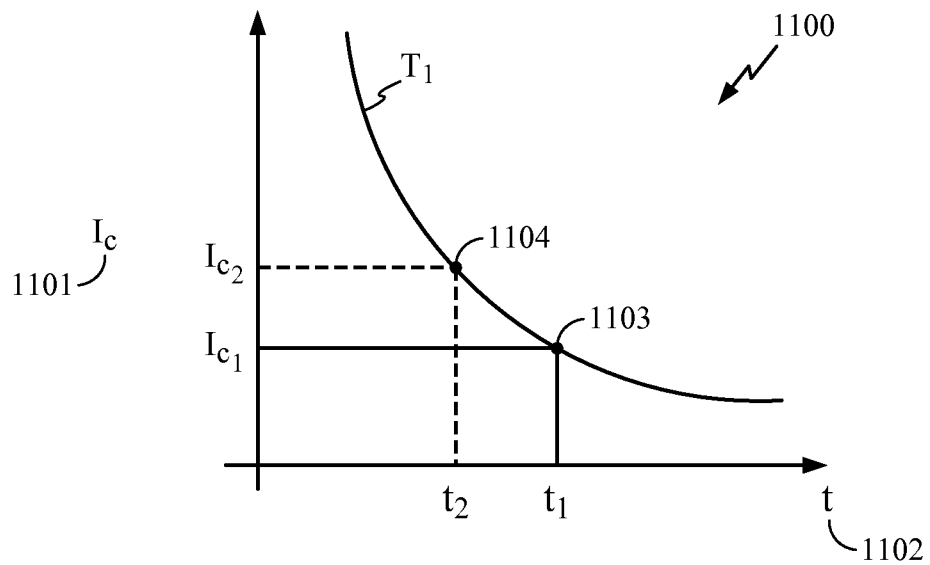
FIG. 11 is a graph of switching characteristics for an MTJ memory design $T_1$.

In considering the switching characteristics of an STT MRAM design, the switching of states follows a particular set of parameters. FIG. 11 is a graph 1100 of the switching characteristics for an STT MRAM design. The switching characteristics follow a characteristics curve, $T_1$, illustrated in the graph 1100. The characteristics curve $T_1$ addresses the critical switching current, $I_C$ 1101, as a function of the switching time, t 1102. The memory is first designed to the characteristics at point 1103 of the characteristics curve $T_1$. With these functional characteristics, by applying a current, $I_{C1}$, to the memory design, the magnetic memory will switch after a time, $t_1$. In order to increase the switching speed of the memory design to a time, $t_2$, a current of $I_{C2}$ will need to be applied to the memory. In designing a memory system that would provide for this new switching time of $t_2$ according to point 1104 of the characteristics curve $T_1$, the designers will need to address certain design trade-offs. For example, the existing devices may have power sources that are limited to supply only the current, $I_{C1}$. Thus, to make the improvement in switching speed, the power supplies will be replaced. This replacement may cost more because of the higher power output requirements, or may take up more space, or will likely use more power during operation. In a mobile device that operates on battery power, power consumption is a serious consideration. Therefore, the decrease in switching time may not be cost-effective considering the additional monetary and power costs the decrease may require.

Figure 12:
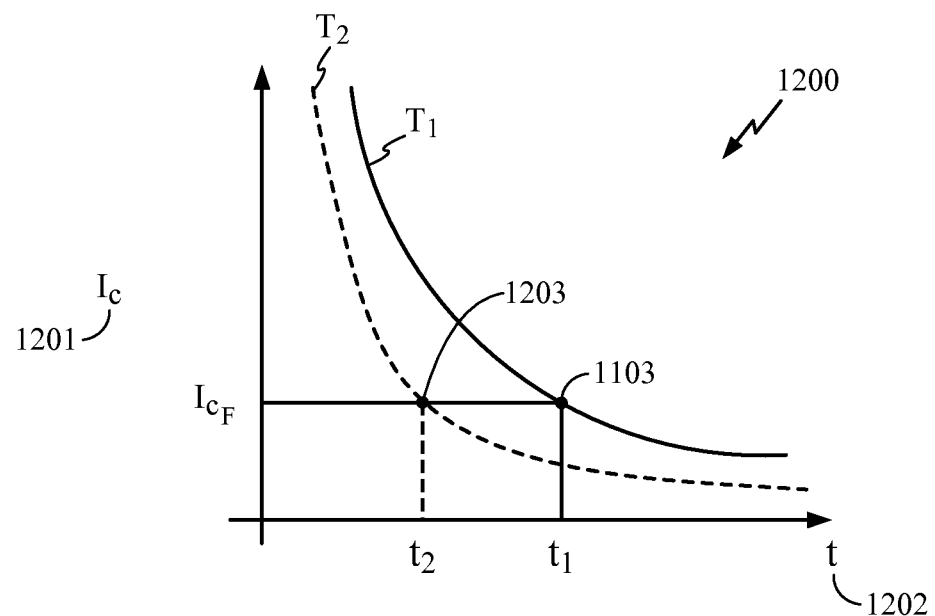
FIG. 12 is a graph of switching characteristics of a first MTJ memory design and a second MTJ memory design configured according to one embodiment of the present teachings.

Instead of attempting to change the operation of a particular memory design, the various embodiments of the present teachings have changed the design itself. With the change in the design, the overall operational characteristics are changed. FIG. 12 is a graph 1200 of the switching characteristics of a first memory design represented by the characteristics curve $T_1$ and a second memory design configured according to one embodiment of the present teachings. The characteristics curve $T_1$ addresses the critical switching current, $I_C$ 1201, as a function of the switching time, t 1202. The characteristics curve $T_1$ represents the same switching characteristics illustrated in FIG. 11. At point 1103, the characteristics reflect a switching time of $t_1$ with the application of the current, $I_{CF}$. The memory design configured according to one embodiment of the present teachings has operational characteristics reflected in the characteristics curve, $T_2$. The $T_2$ memory design improves switching by increasing the voltage applied to the associated source line and reduces the overall parasitic resistance, as described with respect to FIGS. 7 and 9. Because the memory design reflected by the characteristics curve $T_2$ has created a faster switching memory, the entire characteristic curve $T_2$ has shifted in time. Therefore, at point 1203, by providing the same critical current $I_{CF}$, the new memory design switches at time $t_2$. By switching more quickly, the word line may shut off more quickly, which saves power for the underlying system.

Figure 13:
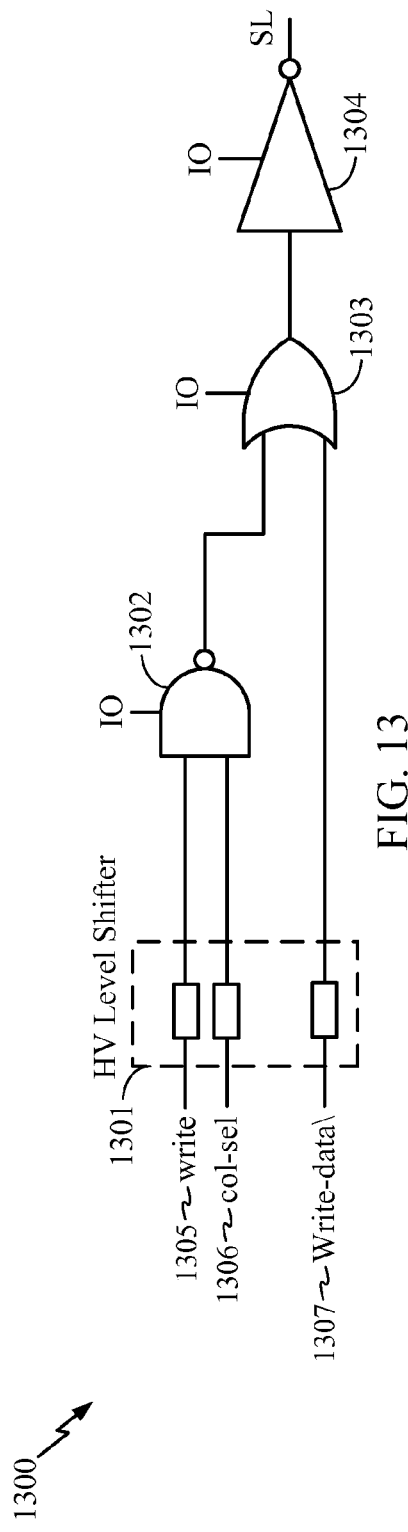
FIG. 13 is a logic diagram illustrating a cell selection circuit configured according to one embodiment of the present teachings.

In designing the high voltage driver 907 (FIG. 9) of the magnetic memory 90 (FIG. 9), switching logic is added in order to perform the switching functionality previously provided by the column switches 304 (FIG. 3). FIG. 13 is a logic diagram illustrating a cell selection circuit 1300 configured according to one embodiment of the present teachings. The cell selection circuit 1300 provides switching functionality for higher voltage source line drivers configured according to one embodiment of the present teachings. Three signals are used in controlling the switching functionality in the cell selection circuit 1300. A write signal 1305 represents the signal received from the word line when a memory "write" is activated. The column-select (col-sel) signal 1306 is another signal that comes from the word line as address information. The address information is decoded to obtain the col-sel signal 1306. In handling the higher voltages, level shifters 1301 provide voltage conversions from the lower voltages of the magnetic memory system. The write-data signal 1307 is a signal that represents the data that is to be written to the memory cell.

Using these three signals, the write signal 1305, the col-sel signal 1306, and the write-data signal 1307, the cell selection circuit 1300 determines whether to bias its source line or not. The write signal 1305 and the col-sel signal 1306 are input into a NAND gate 1302. The resulting signal from the NAND gate 1302 is used with the write-data signal 1307 as input to an OR gate 1303. The resulting signal from the OR gate 1303 is then processed through an inverting buffer 1304. The inverting buffer 1304 will bias the source line with the higher voltage level when the resulting signal from the OR gate 1303 is a logical '0', or will leave the source line at 0 V when the resulting signal from the OR gate 1303 is a logical '1'. Thus, when attempting to write a '0' to the memory cell, the source line will be biased at the higher voltage level, and when attempting to write a '1' to the memory cell, the source line will be biased at 0 V. The entire operational characteristics of the cell selection circuit 1300 are provided below in Table 1. The 'X' entries in Table 1 represent an instance where the result would not change regardless of whether the signal was a '0' or a '1'.

TABLE 1

| Write | Col-Sel | Data | SL |
|---|---|---|---|
| 0 | X | X | 0 |
| X | 0 | X | 0 |
| 1 | 1 | 0 | 1 |
| 1 | 1 | 1 | 0 |

Figure 14:
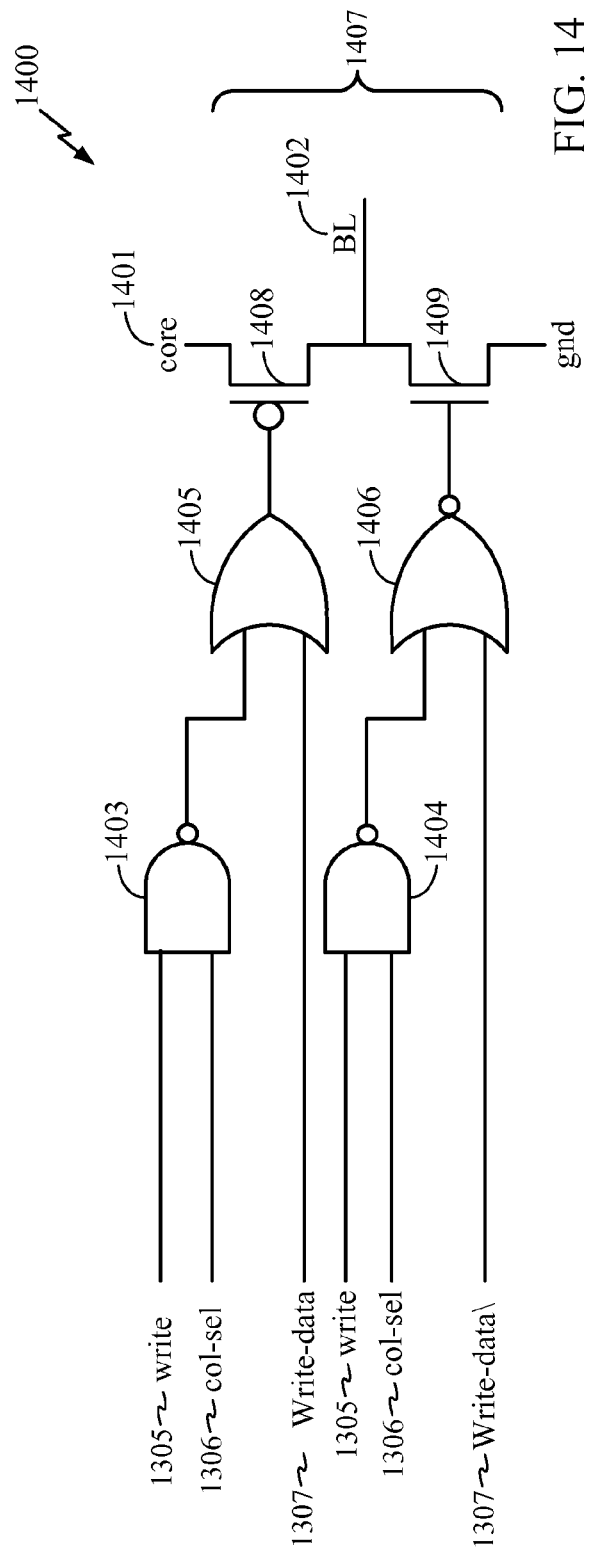
FIG. 14 is a logic diagram illustrating a cell selection circuit configured according to one embodiment of the present teachings.

FIG. 14 is a logic diagram illustrating a cell selection circuit 1400 configured according to one embodiment of the present teachings. The cell selection circuit 1400 provides switching functionality for lower voltage bit line drivers configured according to one embodiment of the present teachings. The cell selection circuit 1400 uses the same three signals used by the cell selection circuit 1300 (FIG. 13). The write signal 1305 and the col-sel signals 1306 are used as input into a NAND gate 1403. The resulting signal from the NAND gate 1403 is used with the write-data signal 1307 as input to an OR gate 1405. The resulting signal from the OR gate 1405 is used as gate input to the p-type transistor 1408 portion of a complementary metal oxide silicon (CMOS) configured switch 1407.

The write signal 1305 and col-sel signal 1306 are also used as input to a NAND gate 1404. The resulting signal from the NAND gate 1404 is used along with the write-data signal 1307 as input to an OR gate 1406. The resulting signal from the OR gate 1406 is used as gate input to the n-type transistor 1409 of the CMOS configured switch 1407. A core voltage 1401 is coupled to one terminal of the p-type transistor 1408. Based on how the p-type transistor 1408 and the n-type transistor 1409 are biased, the cell selection circuit 1400 will either bias the bit line 1402 with the lower voltage level or leave the bit line 1402 at 0 V. Thus, when attempting to write a '1' to the memory cell, the bit line 1402 will be biased at the lower voltage level, and when attempting to write a '0' to the memory cell, the bit line 1402 will be biased at 0 V. The entire operational characteristics of the cell selection circuit 1300 are provided below in Table 2. The 'X' entries in Table 2 represent an instance where the result would not change regardless of whether the signal was a '0' or a '1'.

TABLE 2

| Write | Col-Sel | Data | BL |
|---|---|---|---|
| 0 | X | X | 0 |
| X | 0 | X | 0 |
| 1 | 1 | 0 | 0 |
| 1 | 1 | 1 | 1 |

It should be noted that the cell selection circuits described and illustrated with respect to FIGS. 13 and 14 are merely examples of the circuit configurations that may be incorporated into the higher voltage source line drivers and the lower voltage bit line drivers. Various additional embodiments of the present teachings may utilize different logic configurations to implement memory bit cell selection.

Figure 15:
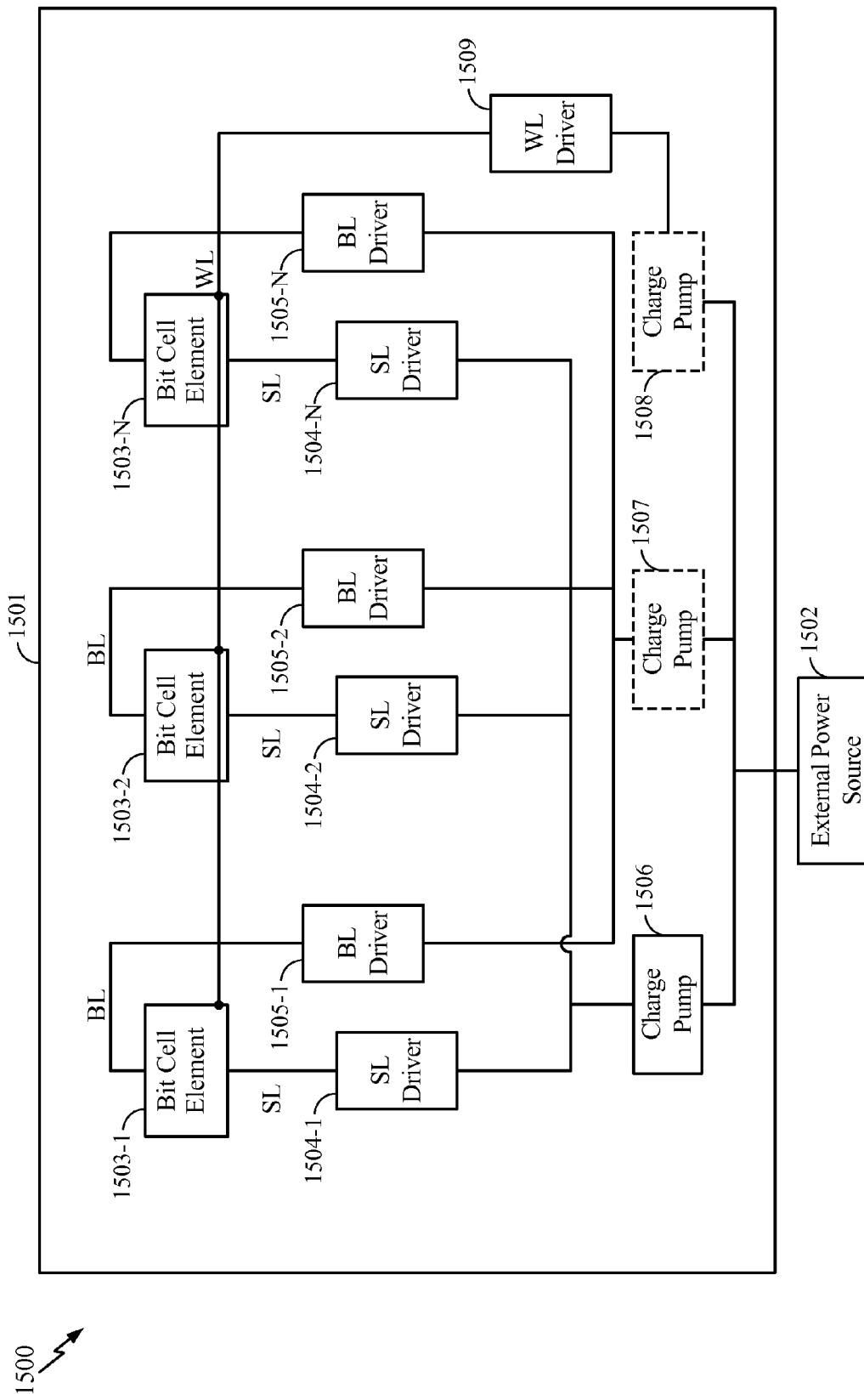
FIG. 15 is a block diagram illustrating a magnetic bit cell device configured according to one embodiment of the present teachings.

FIG. 15 is a block diagram illustrating a magnetic bit cell device 1500 configured according to one embodiment of the present teachings. The magnetic bit cell device 1500 includes an internal device section 1501 powered by an external power source 1502. The internal device section 1501 includes an array of bit cell elements, such as the bit cell elements 1503-1-1503-N. Each of the bit cell elements 1503-1-1503-N has a bit line (BL), a source line (SL), and a word line (WL), powered, respectively, through SL drivers 1504-1-1504-N, BL drivers 1505-1-1505-N, and a WL driver 1509. In accordance with the teachings presented herein, the embodiment depicted in FIG. 15 provides a higher voltage on the SL through the SL drivers 1504-1-1504-N. This higher voltage is provided by the external power source 1502 through a charge pump 1506. The charge pump 1506 is able to step up or step down the voltage received from the external power source 1502 in order to supply the appropriate higher voltage to the SLs of the bit cell elements 1503-1-1503-N. By utilizing the charge pump 1506, the magnetic bit cell device 1500 is able to use a single voltage supplied from the external power source 1502 to generate and supply the different voltages used for the source lines.

In various alternative embodiments, either one or both of the charge pumps 1507 and 1508 may be implemented in the internal device section 1501. For example, if the source lines are to be provided with a first voltage, and both the bit lines and word lines are to be provided with a second voltage, where the first voltage is higher than the second voltage and the voltage supplied by the external power source 1502 is different than both the first and second voltages, the charge pumps 1506 and 1507 would take the voltage from the external power source 1502 and create the first voltage (by the charge pump 1506) and the second voltage (by the charge pump 1507). In a separate example, if the word line was to be provided with a third voltage, then the third voltage would be created by the charge pump 1508 using the voltage supplied by the external power source 1502.

It should be noted that in selected alternative embodiments, where the voltage to be applied to any of the source, bit, or word lines is equal to the voltage supplied by the external power source 1502, the corresponding charge pump of the charge pumps 1506-1508 may not be included in the internal device section, in which case, the voltage would be supplied to the corresponding drivers, such as the SL drivers 1504-1-1504-N, the BL drivers 1505-1-1505-N, and/or the WL driver 1509, directly from the external power source 1502.

Although specific circuitry has been set forth, it will be appreciated by those skilled in the art that not all of the disclosed circuitry is required to practice the invention. Moreover, certain well known circuits have not been described, to maintain focus on the invention. Similarly, although the description refers to logical "0" and logical "1" in certain locations, one skilled in the art appreciates that the logical values can be switched, with the remainder of the circuit adjusted accordingly, without affecting operation of the present invention.

The improved bit cell elements can be included in mobile devices, such as portable computers, cell phones, hand-held personal communication systems (PCS) units, portable data units such as personal data assistants, fixed location data units such as meter reading equipment, set top boxes, music players, video players, entertainment units, navigation devices, or computers.

Although the present teachings and their advantages have been described in detail, it should be understood that various changes, substitutions and alterations can be made herein without departing from the technology of the teachings as defined by the appended claims. Moreover, the scope of the present application is not intended to be limited to the particular aspects of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding aspects described herein may be utilized according to the present teachings. Accordingly, the appended claims are intended to include within their scope such processes, machines, manufacture, compositions of matter, means, methods, or steps.

What is claimed is:

1. A magnetic bit cell write circuit comprising:
   a first write driver applying a first voltage above a fixed potential to a first terminal;
   a second write driver applying a second voltage that is higher above the fixed potential than said first voltage to a second terminal, the second write driver including a level shifter configured to shift between the first voltage and the second voltage; and
   at least one magnetic tunnel junction (MTJ) structure coupled at the first terminal at a first side to said first write driver and coupled at the second terminal at a second side to said second write driver, wherein the first side of said MTJ structure receives said first voltage and the second side of said MTJ structure receives a ground voltage to change from a first state to a second state and the second side of said MTJ structure receives said second voltage and the first side of said MTJ structure receives said ground voltage to change from said second state to said first state, wherein said first voltage is based at least in part on a core network voltage and said second voltage is based at least in part on an input/output (I/O) network voltage.

2. The magnetic bit cell write circuit of claim 1 further comprising:
   a plurality of columns, said at least one MTJ structure residing in one of said plurality of columns;
   at least one additional MTJ structure in each additional one of said plurality of columns;
   at least one additional low voltage write driver coupled to each additional one of said plurality of columns, said at least one additional low voltage write driver applying said first voltage; and
   at least one additional high voltage write driver coupled to each additional one of said plurality of columns, said at least one additional high voltage write driver applying said second voltage, wherein said at least one additional MTJ structure receives said first voltage to change from said first state to said second state and receives said second voltage to change from said second state to said first state.

3. The magnetic bit cell write circuit of claim 2 further comprising:
   first selection circuitry within said first write driver and said at least one additional low voltage write driver, said first selection circuitry configured to select one of: said at least one MTJ structure and said at least one additional MTJ structure based on address information received during a write command; and
   second selection circuitry within said second write driver and said at least one additional low voltage write driver, said second selection circuitry configured to select one of: said at least one MTJ structure and said at least one additional MTJ structure based on said address information.

4. The magnetic bit cell write circuit of claim 1 integrated into a mobile phone, a set top box, a music player, a video player, an entertainment unit, a navigation device, a computer, a hand-held personal communication systems (PCS) unit, a portable data unit, and/or a fixed location data unit.

5. The magnetic bit cell write circuit of claim 1 integrated into a semiconductor die.

6. A magnetic random access memory (MRAM) comprising:
   a plurality of memory columns, each of said plurality of memory columns having at least one magnetic bit cell;
   a plurality of source lines, each associated with a corresponding column of said plurality of memory columns, each of said plurality of source lines coupled to one terminal of said at least one magnetic bit cell of said corresponding column;
   a plurality of bit lines, each associated with said corresponding column, each of said plurality of bit lines coupled to another terminal of said at least one magnetic bit cell of said corresponding column;
   a plurality of first drivers, each coupled to a corresponding source line of said plurality of source lines, said plurality of first drivers applying a first driver voltage above a fixed potential to change said at least one magnetic bit cell from a first state to a second state and applying a ground voltage to change said at least one magnetic bit cell from said second state to said first state; and
   a plurality of second drivers, each coupled to a corresponding bit line of said plurality of bit lines, said plurality of second drivers applying a second driver voltage above the fixed potential to change said at least one magnetic bit cell from said second state to said first state and applying a ground voltage to change said at least one magnetic bit cell from said first state to said second state, each of the plurality of second drivers including a level shifter configured to shift between the first driver voltage and the second driver voltage, wherein said first driver voltage is based at least in part on a core network voltage and said second driver voltage is based at least in part on an input/output (I/O) network voltage.

7. The MRAM of claim 6 wherein said at least one magnetic bit cell comprises:
   a magnetic tunnel junction (MTJ) structure; and
   a transistor coupled to said MTJ structure.

8. The MRAM of claim 6 further comprising:
   first selection circuitry within each of said plurality of first drivers, said first selection circuitry controlling application of said first driver voltage to a selected corresponding one of said plurality of source lines by said associated one of said plurality of first drivers based on an address signal received from a word line of said MRAM; and
   second selection circuitry within each of said plurality of second drivers, said second selection circuitry controlling application of said second driver voltage to a selected one of said plurality of bit lines by said associated one of said plurality of second drivers based on said address signal.

9. The MRAM of claim 6 wherein said second driver voltage is higher than said first driver voltage.

10. The MRAM of claim 7 wherein said first driver voltage is below a breakdown voltage of said MTJ structure, and said second driver voltage is above an assured switching voltage of said MTJ structure.

11. The MRAM of claim 6 integrated into a semiconductor die.

12. The MRAM of claim 6 integrated into a mobile phone, a set top box, a music player, a video player, an entertainment unit, a navigation device, a computer, a hand-held personal communication systems (PCS) unit, a portable data unit, and/or a fixed location data unit.

13. A method for writing to a magnetic tunnel junction (MTJ) structure of a magnetic bit cell element, said method comprising:
receiving a write signal on a word line associated with said MTJ structure;
in response to said write signal, detecting a write data to be written to said MTJ structure;
in response to said write data being a first value, receiving a first voltage above a fixed potential on a bit line coupled to one terminal of said MTJ structure, and receiving a ground voltage on a source line, said first voltage causing said MTJ structure to change from a first state to a second state; and
in response to said write data being a second value, receiving a second voltage above the fixed potential on the source line coupled to another terminal of said MTJ structure, and receiving said ground voltage on the bit line, said second voltage being higher than said first voltage and causing said MTJ structure to change from said second state to said first state, wherein said first voltage is based at feast in part on a core network voltage and said second voltage is based at least in part on an input/output (I/O) network voltage.

14. The method of claim 13 in which said magnetic bit cell element is integrated into a semiconductor die.

15. The method of claim 13, in which the magnetic bit cell element is integrated into a mobile phone, a set, top box, a music player, a video player, an entertainment unit, a navigation device, a computer, a hand-held personal communication systems (PCS) unit, a portable data unit, and/or a fixed location data unit.

16. The method of claim 13 wherein said bit cell element comprises:
a magnetic memory; or
a magnetic spin-logic device.

17. A method for writing to a magnetic tunnel junction (MTJ) structure of a magnetic bit cell element, said method comprising the steps of:
receiving a write signal on a word line associated with said MTJ structure;
in response to said write signal, detecting a write data to be written to said MTJ structure;
in response to said write data being a first value, receiving a first voltage above a fixed potential on a bit line coupled to one terminal of said MTJ structure, and receiving a ground voltage on a source line, said first voltage causing said MTJ structure to change from a first state to a second state; and
in response to said write data being a second value, receiving a second voltage above the fixed potential on the source line coupled to another terminal of said MTJ structure, and receiving said ground voltage on the bit line, said second voltage being higher than said first voltage and causing said MTJ structure to change from said second state to said first state, wherein said first voltage is based at least in part on a core network voltage and said second voltage is based at least in part on an input/output (I/O) network voltage.

18. The method of claim 17 in which the magnetic bit cell element is integrated into a semiconductor die.

19. The method of claim 17 in which the magnetic bit cell element is integrated into a mobile phone, a set top box, a music player, a video player, an entertainment unit, a navigation device, a computer, a hand-held personal communication systems (PCS) unit, a portable data unit, and/or a fixed location data unit.

20. The method of claim 17 wherein said magnetic bit cell element comprises:
a magnetic memory; or
a magnetic spin-logic device.

21. A system for writing to a magnetic tunnel junction (MTJ) structure of a magnetic bit cell element, said system comprising:
means for receiving a write signal on a word line associated with said MTJ structure;
means, executable in response to said write signal, for detecting write data to be written to said MTJ structure;
means, executable in response to said write data being a first value, for receiving a first voltage above a fixed potential on a bit line coupled to one terminal of said MTJ structure, and for receiving a ground voltage on a source line, said first voltage causing said MTJ structure to change from a first state to a second state; and
means, executable in response to said write data being a second value, for receiving a second voltage above the fixed potential on the source line coupled to another terminal of said MTJ structure, and for receiving said ground voltage on the bit line, said second voltage being higher than said first voltage and causing said MTJ structure to change from said second state to said first state, wherein said first voltage is based at least in part on a core network voltage and said second voltage is based at least in part on an (I/O) network voltage.

22. The system of claim 21 integrated into a semiconductor die.

23. The system of claim 21 integrated into a mobile phone, a set top box, a music player, a video player, an entertainment unit, a navigation device, a computer, a hand-held personal communication systems (PCS) unit, a portable data unit, and/or a fixed location data unit.

24. The system of claim 21 wherein said magnetic bit cell element comprises:
a magnetic memory; or
a magnetic spin-logic device.

* * * * *